United States Patent
Tomekawa et al.

(10) Patent No.: US 12,094,893 B2
(45) Date of Patent: *Sep. 17, 2024

(54) CAPACITOR INCLUDING FIRST ELECTRODE, DIELECTRIC LAYER, AND SECOND ELECTRODE, IMAGE SENSOR, AND METHOD FOR PRODUCING CAPACITOR

(71) Applicant: PANASONIC INTELLECTUAL PROPERTY MANAGEMENT CO., LTD., Osaka (JP)

(72) Inventors: Yuuko Tomekawa, Osaka (JP); Takahiro Koyanagi, Osaka (JP); Takeyoshi Tokuhara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 106 days.

This patent is subject to a terminal disclaimer.

(21) Appl. No.: 17/391,793

(22) Filed: Aug. 2, 2021

(65) Prior Publication Data

US 2021/0366960 A1    Nov. 25, 2021

Related U.S. Application Data

(63) Continuation of application No. 16/118,220, filed on Aug. 30, 2018, now Pat. No. 11,114,481.

(30) Foreign Application Priority Data

Sep. 12, 2017    (JP) .................................. 2017-175022

(51) Int. Cl.
*H01L 27/146*    (2006.01)
*H01L 49/02*    (2006.01)

(52) U.S. Cl.
CPC ........ *H01L 27/14609* (2013.01); *H01L 28/60* (2013.01)

(58) Field of Classification Search
CPC ......... H01L 28/40–92; H01L 27/10811; H01L 27/10852

See application file for complete search history.

(56) References Cited

U.S. PATENT DOCUMENTS

| 6,043,561 A | 3/2000 | Katori et al. |
| 2003/0096472 A1 | 5/2003 | Kang et al. |

(Continued)

FOREIGN PATENT DOCUMENTS

| CN | 101399116 A | 4/2009 |
| JP | 8-153707 A | 6/1996 |

(Continued)

OTHER PUBLICATIONS

Non-Final Office Action issued in U.S. Appl. No. 16/118,220, dated Nov. 29, 2019.

(Continued)

*Primary Examiner* — Brian Turner
(74) *Attorney, Agent, or Firm* — Rimon P.C.

(57) ABSTRACT

A capacitor includes a first electrode, a second electrode facing the first electrode, and a dielectric layer disposed between the first and second electrodes and being in contact with each of the first and second electrodes. The dielectric layer has a thickness of 10 nm or more. The first electrode contains carbon. At the interface between the dielectric layer and the first electrode, an elemental percentage of carbon is 30 atomic % or less.

20 Claims, 6 Drawing Sheets

(56) References Cited

U.S. PATENT DOCUMENTS

| | | |
|---|---|---|
| 2003/0107076 A1* | 6/2003 | Lin .................. H01L 28/60 |
| | | 257/E21.011 |
| 2003/0175999 A1 | 9/2003 | Mikawa et al. |
| 2004/0141390 A1 | 7/2004 | Won et al. |
| 2005/0051824 A1 | 3/2005 | Izuka et al. |
| 2005/0152094 A1 | 7/2005 | Jeong et al. |
| 2007/0117340 A1 | 5/2007 | Steltenpohl |
| 2008/0142863 A1 | 6/2008 | Shibata |
| 2008/0188055 A1 | 8/2008 | Wang et al. |
| 2008/0265371 A1 | 10/2008 | Park et al. |
| 2009/0086404 A1 | 4/2009 | Masuda et al. |
| 2010/0046138 A1 | 2/2010 | Do et al. |
| 2010/0065944 A1 | 3/2010 | Tu et al. |
| 2010/0084740 A1* | 4/2010 | Lee .................. H01L 28/40 |
| | | 257/532 |
| 2011/0128667 A1 | 6/2011 | Do et al. |
| 2012/0077322 A1* | 3/2012 | Hirota ............ H01L 21/02186 |
| | | 257/E21.24 |
| 2013/0089964 A1* | 4/2013 | Iwaki ............. H01L 21/02252 |
| | | 438/381 |
| 2013/0143383 A1 | 6/2013 | Malhotra et al. |
| 2013/0320479 A1 | 12/2013 | Ahn et al. |
| 2015/0076495 A1 | 3/2015 | Miyairi |
| 2015/0303206 A1 | 10/2015 | Chavan et al. |
| 2015/0364535 A1 | 12/2015 | Triyoso et al. |
| 2016/0293654 A1 | 10/2016 | Tomekawa et al. |
| 2017/0062037 A1 | 3/2017 | Nicholes et al. |
| 2017/0170224 A1 | 6/2017 | Huang et al. |
| 2017/0294219 A1 | 10/2017 | Nicholes et al. |

FOREIGN PATENT DOCUMENTS

| | | |
|---|---|---|
| JP | 2005-243921 A | 9/2005 |
| JP | 2007-329286 A | 12/2007 |
| JP | 2015-084411 A | 4/2015 |
| JP | 2016-076921 A | 5/2016 |
| JP | 2016-197617 A | 11/2016 |
| JP | 2017-120904 A | 7/2017 |
| TW | 382818 B | 2/2000 |
| TW | 200304157 A | 9/2003 |
| WO | 2017/130728 A1 | 8/2017 |

OTHER PUBLICATIONS

Final Office Action issued in U.S. Appl. No. 16/118,220, dated Apr. 16, 2020.

Non-Final Office Action issued in U.S. Appl. No. 16/118,220, dated Aug. 26, 2020.

Final Office Action issued in U.S. Appl. No. 16/118,220, dated Feb. 22, 2021.

Notice of Allowance issued in U.S. Appl. No. 16/118,220, dated May 19, 2021.

English Translation of Chinese Search Report dated Mar. 1, 2023 for the related Chinese Patent Application No. 201810800181.4.

English Translation of Chinese Search Report dated Sep. 29, 2023 for the related Chinese Patent Application No. 201810800181.4.

* cited by examiner

CAPACITOR INCLUDING FIRST ELECTRODE, DIELECTRIC LAYER, AND SECOND ELECTRODE, IMAGE SENSOR, AND METHOD FOR PRODUCING CAPACITOR

CROSS-REFERENCE OF RELATED APPLICATIONS

This application is a Continuation application of U.S. patent application Ser. No. 16/118,220, filed on Aug. 30, 2018, which in turn claims the benefit of Japanese Application No. 2017-175022, filed on Sep. 12, 2017, the entire disclosures of which Applications are incorporated by reference herein.

BACKGROUND

1. Technical Field

The present disclosure relates to a capacitor, an image sensor, and a method for producing a capacitor.

2. Description of the Related Art

In the semiconductor industry, capacitors are an essential device for integrated circuits (ICs), such as memories and image sensors. Known examples of capacitor structures include MOS (metal oxide semiconductor) and MIM (metal insulator metal).

Increasing the capacitance of capacitors has been a challenge in recent years. For example, Japanese Unexamined Patent Application Publication 2016-76921 discloses a capacitor that includes an insulating film made from a material having a higher permittivity than silicon oxide ($SiO_2$), such as $ZrO_2$.

SUMMARY

In one non-limiting and exemplary general aspect, the techniques disclosed here feature a capacitor. The capacitor includes a first electrode, a second electrode facing the first electrode, and a dielectric layer disposed between the first and second electrodes and being in contact with each of the first and second electrodes. The dielectric layer has a thickness of 10 nm or more. The first electrode contains carbon. At the interface between the dielectric layer and the first electrode, an elemental percentage of carbon is 30 atomic % or less.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of the Present Disclosure

The advancements in scaling technologies in recent years have been pushing forward the semiconductor industry for higher density and capacity rapidly. As the density of an IC is increased, the capacitor area, the area in plan view available for the placement of capacitors, is reduced. A way to achieve a small capacitor area without compromising the capacitance of capacitors is to make the insulating film of the capacitors thin, but thin-dielectric-film capacitors, prone to dielectric breakdown, may cause soft errors and make the product's reliability questionable.

Insulating films used commonly in a capacitor are silicon oxide, silicon nitride, and a composite thereof. However, researchers have been working on the use of a film of a metal oxide having a higher permittivity than silicon oxide, in an effort to further increase the capacitance of capacitors.

Materials having a higher permittivity than silicon oxide are called high-k materials, typical examples of which include $HfO_2$ and $ZrO_2$. An insulating film made from a high-k material would give a capacitor a high capacitance requiring a small area, compared with that made from silicon oxide.

However, when a high-permittivity insulating film, such as of $HfO_2$, is used in a capacitor having the well-known polycrystalline silicon electrodes, $SiO_2$ is formed at the interfaces between the electrodes and insulating film. This low-permittivity material affects the capacitance of the capacitor and reduces the metal oxide film, causing an increase in leakage current. $HfO_2$ and similar materials are therefore difficult to use on polycrystalline silicon.

As a solution to this, metal nitrides, such as TiN, are being investigated for their potential use as an electrode material. Metal nitrides are stable and good in workability.

Even with metal nitride electrodes, however, the disadvantage remains that the crystallinity and surface roughness of the lower electrode affect the quality of the insulating film. The resulting increase in leakage current and decrease in withstand voltage impair the reliability of the capacitor seriously.

An aspect of the disclosure can be outlined as follows.

A capacitor according to an aspect of the present disclosure includes a first electrode, a second electrode facing the first electrode, and a dielectric layer disposed between the first and second electrodes and being in contact with each of the first and second electrodes. The dielectric layer has a thickness of 10 nm or more. The first electrode contains carbon. At the interface between the dielectric layer and the first electrode, an elemental percentage of carbon is 30 atomic % (at %) or less.

This aspect provides a capacitor highly insulating and good in withstand voltage characteristics. Since carbon constitutes only a small proportion of atoms at the interface between the first electrode and dielectric layer, the dielectric layer contains accordingly few grain boundaries or crystal imperfections resulting from carbon. The increased quality of the dielectric layer results in less leakage current generated.

In a capacitor according to an aspect of the present disclosure, the dielectric layer may be made of at least one selected from the group consisting of a hafnium oxide and a zirconium oxide. In a capacitor according to an aspect of the present disclosure, the dielectric layer may contain at least one selected from the group consisting of a hafnium oxide and a zirconium oxide as a main component.

This aspect provides a capacitor having a high capacitance. The hafnium oxide or zirconium oxide gives the capacitor a high capacitance by virtue of its high permittivity.

The first electrode may be, for example, made of at least one selected from the group consisting of a titanium nitride and a tantalum nitride. The first electrode may, for example, contain at least one selected from the group consisting of a titanium nitride and a tantalum nitride as a main component. The mole percentage of the at least one selected from the group consisting of a titanium nitride and a tantalum nitride in the first electrode may be 50% or more.

This makes the dielectric layer better in quality, further reducing the leakage current generated. Since the first electrode in this case is improved in surface roughness, the dielectric layer contains accordingly few grain boundaries or crystal imperfections resulting from irregularities of the surface of the first electrode.

The interface may, for example, have a trenched shape, depressed in part in the direction from the second electrode toward the first electrode, and the dielectric layer may be provided along the trenched shape. The dielectric layer may be substantially uniform in thickness.

This aspect provides a capacitor having a higher capacitance. The three-dimensional structure gives the capacitor a larger electrode area, helping increase the capacitance of the capacitor while maintaining a small area of the capacitor in plan view.

An image sensor according to an aspect of the present disclosure includes at least one selected from the group consisting of a photoelectric transducer and a photodiode and also includes an above-described capacitor.

This image sensor is highly reliable owing to the high insulating properties, good withstand voltage characteristics, and high capacitance of the capacitor.

A method according to an aspect of the present disclosure for producing a capacitor includes stacking a first electrode containing carbon, a dielectric layer having a thickness of 10 nm or more, and a second electrode in this order and subjecting the uppermost surface of the first electrode to plasma treatment.

A capacitor produced in this aspect is highly insulating and good in withstand voltage characteristics. The plasma treatment of the uppermost surface of the first electrode reduces the carbon content there. The dielectric layer on the first electrode is therefore formed containing accordingly few grain boundaries or crystal imperfections resulting from carbon. The increased quality of the dielectric layer results in less leakage current generated.

In a method according to an aspect of the present disclosure for producing a capacitor, the dielectric layer may be made of at least one selected from the group consisting of a hafnium oxide and a zirconium oxide. In a method according to an aspect of the present disclosure for producing a capacitor, the dielectric layer may contain at least one selected from the group consisting of a hafnium oxide and a zirconium oxide as a main component.

A capacitor produced in this aspect has a high capacitance. The hafnium oxide or zirconium oxide gives the capacitor a high capacitance by virtue of its high permittivity.

The plasma treatment may, for example, be performed in a nitrogen or oxygen atmosphere.

This ensures that the carbon content can be reduced without affecting the quality of the capacitor.

The first electrode may be, for example, made primarily of at least one selected from the group consisting of a titanium nitride and a tantalum nitride, and, in the stacking, the first electrode may be formed by chemical vapor deposition or atomic layer deposition.

This ensures that the capacitor is produced with high reliability, a high capacitance, and still a small area in plan view even if it has a three-dimensional structure. In this arrangement, the first electrode is formed uniform in thickness on the sides of the three-dimensional structure.

The following describes embodiments of the present disclosure in detail, with reference to drawings. It should be noted that the following embodiments are all general or specific examples, in which the numerical values, shapes, materials, elements, arrangements of and connections between elements, production steps, orders of production steps, and the like are illustrative and not intended to limit any aspect of the disclosure. The various aspects set forth herein can be combined unless contradictory. Moreover, those elements in the following embodiments that are not recited in an independent claim, which defines the most generic concept, are described as optional.

The drawings are schematic and are not necessarily precise. For example, the drawings are not necessarily true to scale. Functionally equivalent elements may hereinafter be referenced by the same designator throughout the drawings so that duplicate explanations can be omitted or brief.

The terms "above" and "below" as mentioned herein are not in the absolute upward and downward directions (vertically upward and downward directions, respectively) but are defined by the relative positions of layers in the multilayer structure, which are based on the order of stacking of the layers. The terms "above" and "below," moreover, are used to describe not only a situation in which two elements are spaced with another element therebetween, but also a situation in which two elements are in contact with each other.

Embodiments

Figure 1:
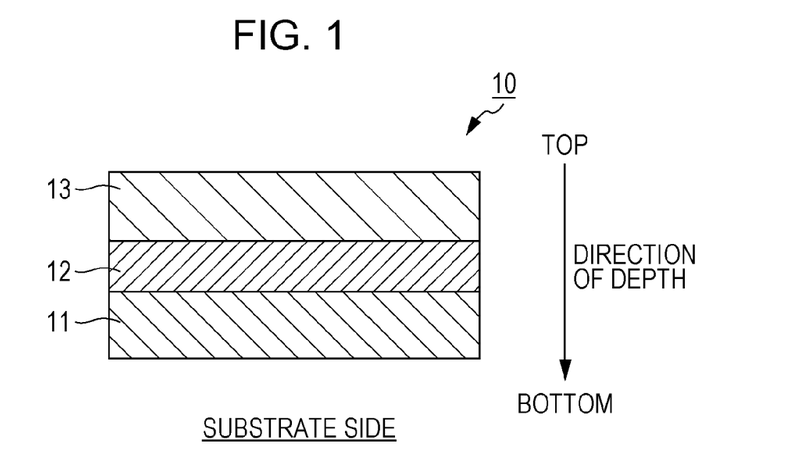
FIG. 1 is a cross-sectional diagram illustrating an exemplary structure of a capacitor according to an embodiment.

FIG. 1 is a cross-sectional diagram illustrating an exemplary structure of a capacitor 10 according to an embodiment.

As illustrated in FIG. 1, the capacitor 10 has a lower electrode 11, a dielectric layer 12, and an upper electrode 13. The capacitor 10 is formed by the lower electrode 11, dielectric layer 12, and upper electrode 13 stacked in this order above a substrate (not illustrated).

The lower electrode 11 and upper electrode 13 are an example of first and second electrodes facing each other. The dielectric layer 12 is between the lower electrode 11 and upper electrode 13 and in contact with each of the lower electrode 11 and upper electrode 13.

As illustrated in FIG. 1, the capacitor 10 is a parallel-plate capacitor. Specifically, each of the lower electrode 11, dielectric layer 12, and upper electrode 13 is a flat plate, substantially uniform in thickness. The lower electrode 11 and upper electrode 13 are parallel to each other with the dielectric layer 12 therebetween. The top surface, or uppermost surface, of the lower electrode 11 is in contact with the bottom surface of the dielectric layer 12. The bottom surface of the upper electrode 13 is in contact with the top surface of the dielectric layer 12.

The electrode area of the capacitor 10 corresponds to the area of overlap between the upper electrode 13 and lower electrode 11 in plan view, or the area of overlap as measured when the capacitor 10 is viewed in the direction of stacking. The direction of stacking is opposite the direction of depth in FIG. 1, i.e., the direction from bottom to top.

The lower electrode 11 is an example of a first electrode the capacitor 10 includes. The lower electrode 11 is made of an electroconductive material. Examples include electroconductive metal nitrides, such as titanium nitride (TiN), tantalum nitride (TaN), and hafnium nitride (HfN). The top surface of the lower electrode 11 has a sufficiently low surface roughness Ra and is high quality. Other electroconductive materials can also be used, including electroconductive oxides, such as indium tin oxide (ITO) and zinc oxide (ZnO), and metals, such as titanium (Ti), aluminum (Al), gold (Au), and platinum (Pt).

The lower electrode 11 is formed by depositing a thin film of an electroconductive material, for example above a substrate, by metal organic chemical vapor deposition (MOCVD), atomic layer deposition (ALD), sputtering, or any other process. The thickness of the lower electrode 11 is 10 nm or more and 100 nm or less for example, but other thicknesses are also possible.

The lower electrode 11 contains carbon (C) that comes from, for example, the organic material used for the deposition of the lower electrode 11. At the interface between the lower electrode 11 and dielectric layer 12, the elemental percentage of carbon is 30 at % or less. The elemental percentage of carbon in the lower electrode 11 can be measured by, for example, time-of-flight secondary ion mass spectrometry (ToF-SIMS).

The upper electrode 13 is an example of a second electrode the capacitor 10 includes. The material for the upper electrode 13 can be the same as or different from that for the lower electrode 11. The upper electrode 13 is formed by depositing a thin film of an electroconductive material, for example over a region of the dielectric layer 12 overlapping with the lower electrode 11 in plan view, using a process such as MOCVD, ALD, or sputtering similar to the lower electrode 11. The thickness of the upper electrode 13 is 200 nm for example, but other thicknesses are also possible.

The dielectric layer 12 is a layer of a high-k material, a material that exhibits a higher permittivity than silicon oxide ($SiO_2$). Specifically, the dielectric layer 12 is made primarily of at least one selected from the group consisting of a hafnium (Hf) oxide and a zirconium (Zr) oxide. The mole percentage of the at least one selected from the group consisting of a hafnium oxide and a zirconium oxide in the dielectric layer 12 is 50% or more.

The dielectric layer 12 is formed by depositing a thin dielectric film from the hafnium oxide or zirconium oxide, for example on the lower electrode 11, by ALD, EB (electron beam) deposition, or any other process.

The thickness of the dielectric layer 12 is 10 nm or more and may be 10 nm or more and 100 nm or less. The dielectric layer 12 is monoclinic in crystallographic structure.

The thickness of the dielectric layer 12 can be measured as, for example, a physical thickness observed in a transmission electron microscope (TEM) image of its cross-sectional structure. When the area (S) of the capacitor 10 and the permittivity (c) of the dielectric layer 12 are known, the thickness can alternatively be calculated as an average thickness (d) from the capacitance (C) of the capacitor 10 according to the equation $d = \varepsilon \times S/C$.

The crystallographic structure of the dielectric layer 12 can be identified by analyzing the layer by x-ray diffraction (XRD). Cross-sectional TEM can also be used. Other methods may also be used to measure the thickness and identify the crystallographic structure of the dielectric layer 12.

At the interface between the dielectric layer 12 and lower electrode 11, the elemental percentage of carbon is 30 at % or less. Specifically, the elemental percentage of carbon in the uppermost layer of the lower electrode 11 is 30 at % or less. The uppermost layer is a region in the lower electrode 11 that includes the interface between the dielectric layer 12 and lower electrode 11, or the uppermost surface of the lower electrode 11. The thickness of the uppermost layer is several nanometers or less.

Figure 2:
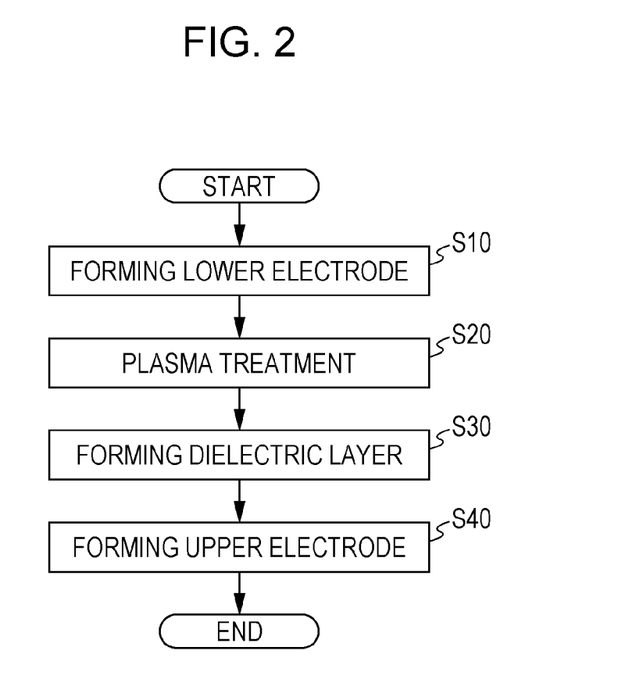
FIG. 2 is a flowchart illustrating a method for producing a capacitor according to an embodiment.

Next, a method for producing a capacitor 10 according to this embodiment is described. A method for producing a capacitor 10 includes stacking a lower electrode 11, a dielectric layer 12, and an upper electrode 13 in this order and subjecting the uppermost surface of the lower electrode 11 to plasma treatment. The following describes a specific production method with reference to FIG. 2. FIG. 2 is a flowchart illustrating a method for producing a capacitor 10 according to this embodiment.

First, a lower electrode 11 is formed above a substrate (not illustrated) (S10), for example by depositing a TiN film by ALD. The feedstock gas is an organic material, such as TDMAT ($Ti[N(CH_3)_2]_4$, tetrakis(dimethylamido)titanium). Since an organic material contains carbon, the lower electrode 11 contains carbon.

Then, the uppermost surface of the lower electrode 11 is subjected to plasma treatment (S20) in a nitrogen or oxygen atmosphere. Plasma treatment in a nitrogen atmosphere and that in an oxygen atmosphere are also referred to as $N_2$ plasma treatment and $O_2$ plasma treatment, respectively.

An exemplary way of doing this is to place the substrate, with the lower electrode 11 formed thereon, in the chamber used in the ALD, feed nitrogen or oxygen gas into the chamber, and then generate plasma. The uppermost surface of the lower electrode 11 is exposed to plasma, and this helps in the release of carbon from the uppermost layer of the lower electrode 11. As a result, the carbon content of the uppermost layer is reduced.

Then, a dielectric electrode 12 is formed on the lower electrode 11 by ALD (S30), for example by depositing a film of a hafnium oxide ($HfO_x$) on the plasma-exposed uppermost surface of the lower electrode 11. A film of a zirconium oxide ($ZrO_x$) may be deposited instead of the hafnium oxide film. The subscript X in $HfO_x$ and $ZrO_x$ is a positive number. An example is X=2, but other values are also possible.

Then, an upper electrode 13 is formed on the dielectric layer 12 (S40), for example by depositing a TiN film on the dielectric layer 12 by ALD.

The resulting capacitor 10 may be subjected to thermal treatment in a nitrogen ($N_2$) atmosphere, or nitrogen annealing. The temperature and duration of the nitrogen annealing are, for example, 400° C. and 30 minutes.

Figure 3:
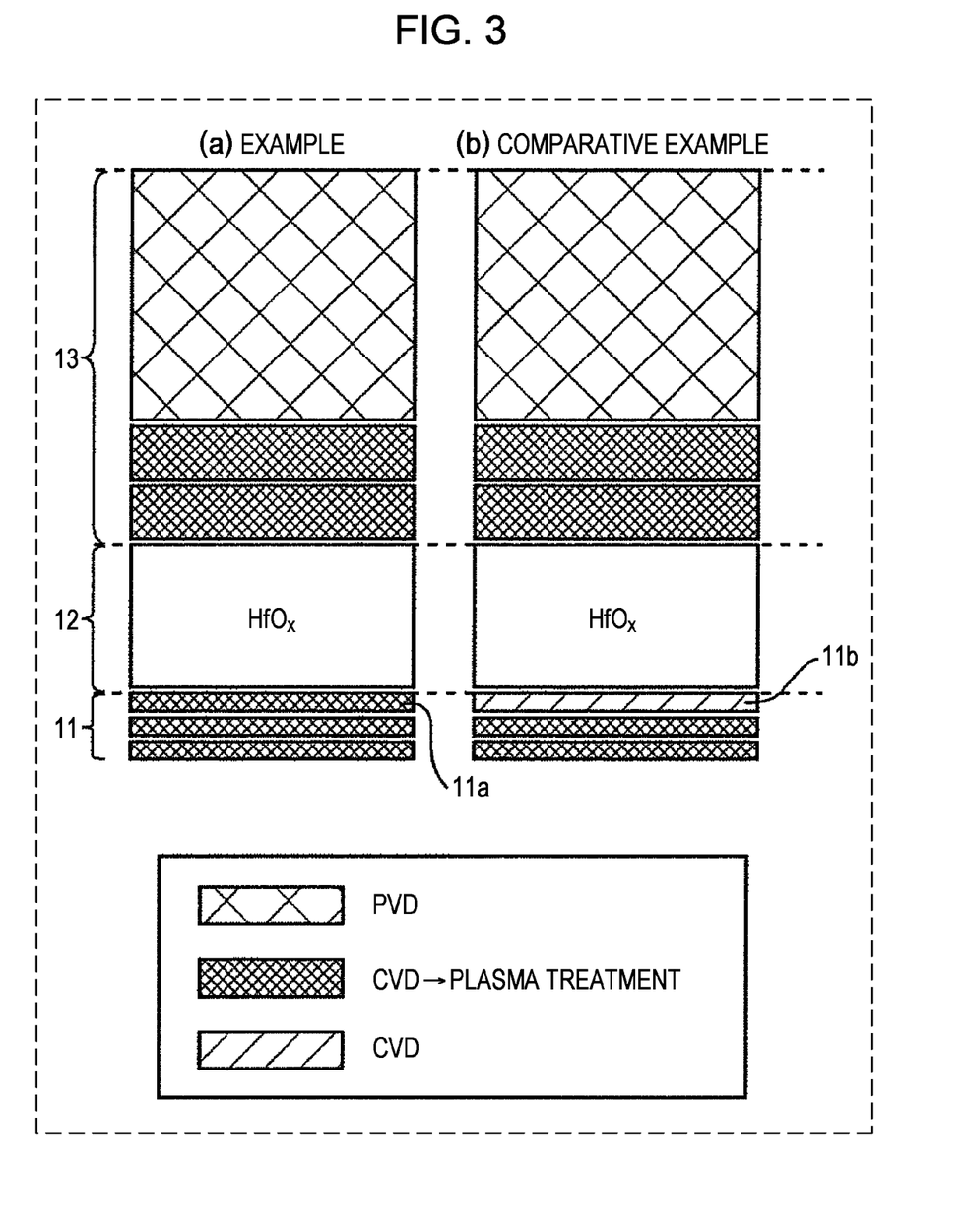
FIG. 3 illustrates detailed formation of the lower electrode of a capacitor according to an embodiment.

Next, the formation of the lower electrode 11 is described in detail with reference to FIG. 3. FIG. 3 illustrates detailed formation of the lower electrode 11 of a capacitor 10 according to this embodiment.

FIG. 3 schematically illustrates how each layer of a capacitor 10 is actually processed. Specifically, in the Example in part (a) of FIG. 3, each of the rectangles represents a step in the formation of each layer of the capacitor 10. The rectangles' height schematically illustrates the thickness of the film deposited in the step, and films indicated by rectangles with the same pattern are processed in the same way. The layers are stacked one by one, in the order from bottom to top in FIG. 3. The same applies to the Comparative Example in part (b) of FIG. 3.

For example, the formation of the uppermost layer 11a of the lower electrode 11 in the Example is represented by a densely cross-hatched rectangle, which means CVD formation of a TiN film with subsequent $N_2$ plasma treatment. In the Comparative Example, the formation of the uppermost layer 11b of the lower layer 11 is represented by a diagonally hatched rectangle, which means CVD formation of a TiN film without subsequent $N_2$ plasma treatment.

The formation of the dielectric layer 12 is represented by a rectangle with the label "$HfO_x$" inside, which means ALD deposition of a $HfO_x$ film. The formation of the top layer of the upper electrode 13 is represented by a loosely cross-hatched rectangle, which means PVD (physical vapor deposition) formation of a TiN film.

For example, the three densely cross-hatched rectangles in the Example in part (a) of FIG. 3, mean that the lower electrode 11 is formed in three divided portions. An illustrative process in that a TiN film is formed by CVD to a predetermined thickness, such as 5 nm, and subjected to $N_2$ plasma treatment, and this operation is repeated three times to form a 15-nm thick TiN film. The uppermost layer 11a, which includes the interface between the lower electrode 11 and dielectric layer 12, is also subjected to $N_2$ plasma treatment.

The Comparative Example in part (b) of FIG. 3 differs from the Example in part (a) of FIG. 3 in the formation of the lower electrode 11. Specifically, the uppermost layer 11b of the lower electrode 11, which includes the interface between the lower electrode 11 and dielectric layer 12, is not subjected to $N_2$ plasma treatment. Whether $N_2$ plasma treatment is performed or not makes a difference in the carbon concentration at the interface between the lower electrode 11 and dielectric layer 12.

Figure 4:
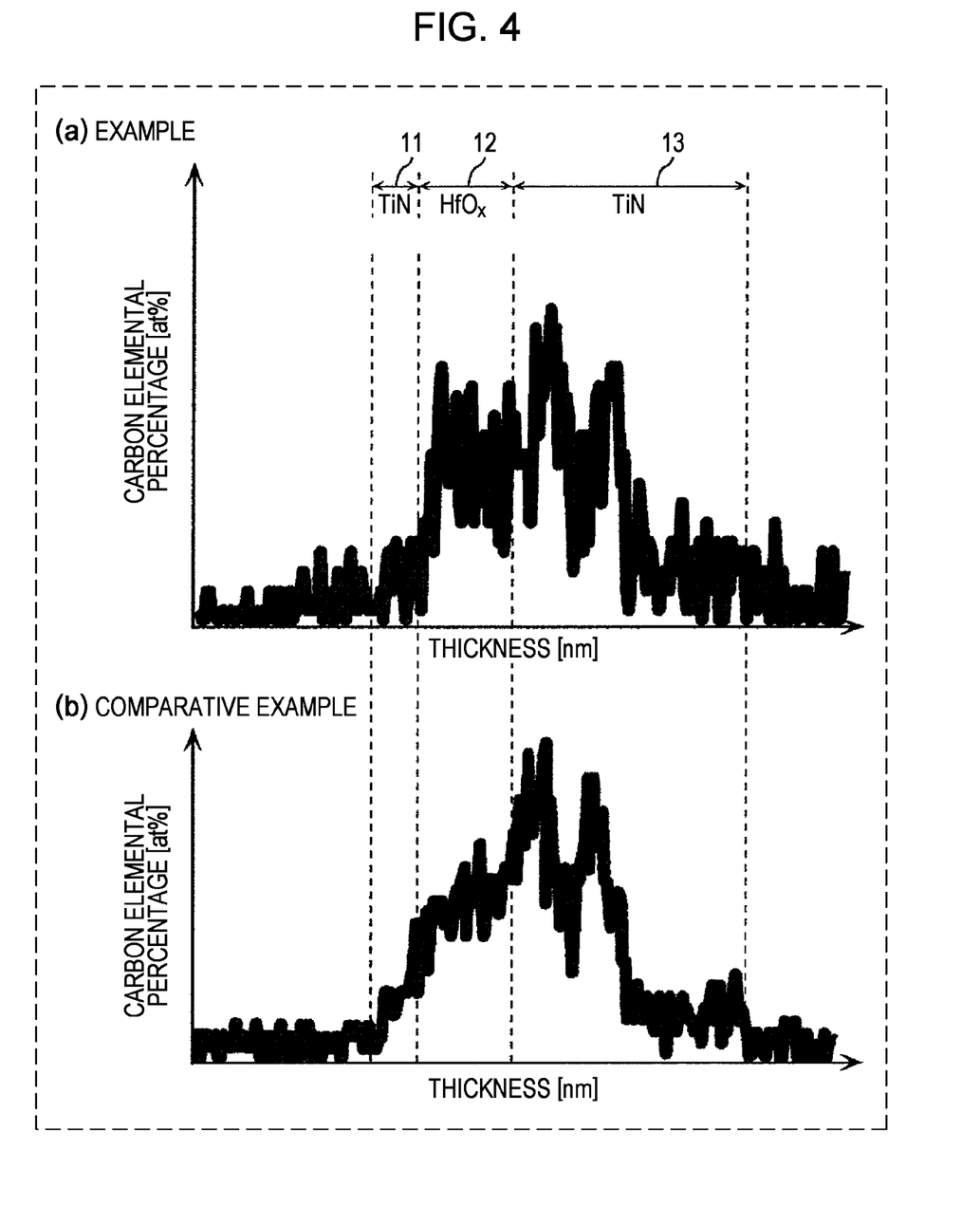
FIG. 4 illustrates the distribution of carbon concentrations in the direction of depth in a capacitor according to an embodiment.

FIG. 4 illustrates the distribution of carbon concentrations in the direction of depth in a capacitor 10 according to this embodiment. Specifically, part (a) of FIG. 4 illustrates measured concentrations of carbon in the Example in part (a) of FIG. 3, and part (b) of FIG. 4 those in the Comparative Example in part (b) of FIG. 3. In both part (a) and part (b) of FIG. 4, the horizontal axis represents thickness [nm], and the vertical axis the elemental percentage of carbon [at %].

As shown in part (b) of FIG. 4, the Comparative Example contained a high concentration of carbon at the interface between the lower electrode 11 and dielectric layer 12. By contrast, the Example, as shown in part (a) of FIG. 4, contained only a low concentration of carbon at the interface between the lower electrode 11 and dielectric layer 12. This indicates that $N_2$ plasma treatment reduces the carbon concentration at the interface between the lower electrode 11 and dielectric layer 12.

Next, a description is given of the relationship between carbon existing at the interface between the lower electrode 11 and dielectric layer 12, the thickness of the dielectric layer 12, and the breakdown voltage of a capacitor 10.

Forming the lower electrode 11 by creating a film of a metal nitride, such as TiN or TaN, using CVD or ALD involves repeated introduction and nitriding a precursor material to build up a nitride film on a substrate. In practice, however, the precursor material is not 100% transformed into the nitride film and will remain in the film, although slight in amount. It is of particular note that nitrides require more energy to produce than oxides, which means that it is difficult to produce TiN or TaN with high purity. In this embodiment, therefore, the deposition of a TiN or TaN preceded $N_2$ plasma treatment.

The inventors fabricated sample capacitors 10 by varying $N_2$ plasma treatment conditions and the thickness of the dielectric layer 12, and evaluated the characteristics of the samples.

Specifically, the inventors prepared three types of samples, three samples per type, in which the uppermost surface of the lower electrode 11 was not subjected to $N_2$ plasma treatment, was subjected to $N_2$ plasma treatment at 750 W for 30 seconds, or was subjected to $N_2$ plasma treatment at 1500 W for 30 seconds. An 8-nm, 19-nm, or 24-nm thick $HfO_x$ film was deposited on each to complete a total of nine samples. The inventors measured the breakdown voltage of the nine samples and analyzed the samples by x-ray photoelectron spectroscopy (XPS) to determine carbon concentrations.

Figure 5:
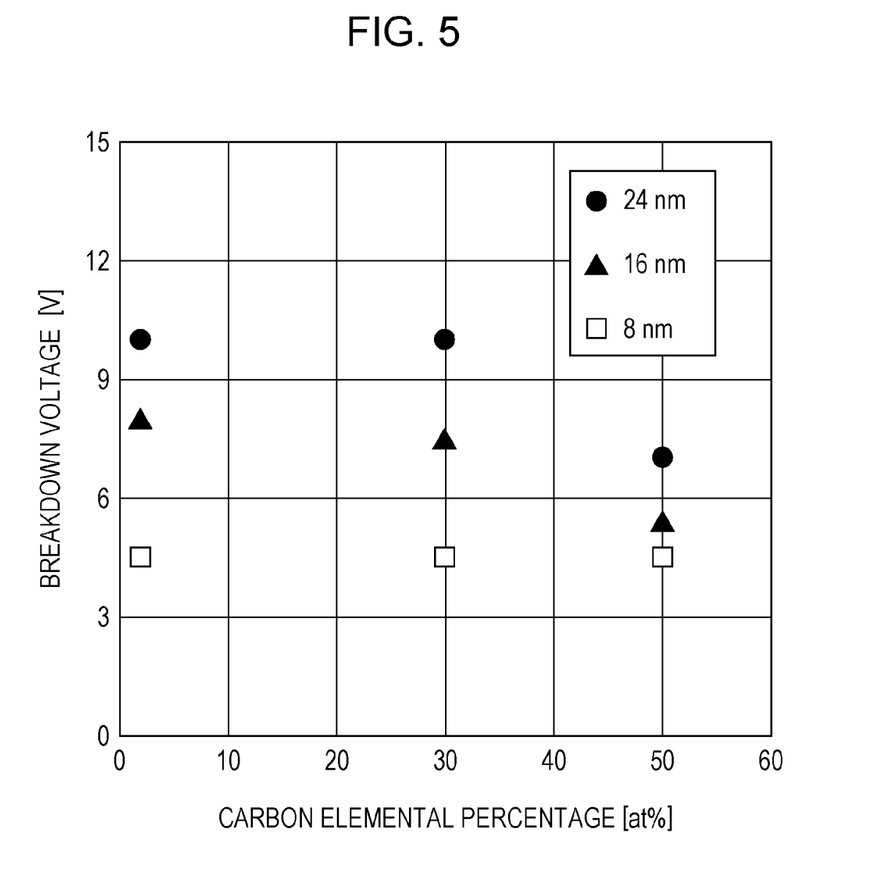
FIG. 5 illustrates the dependence of breakdown voltage on the elemental percentage of carbon at the interface between the dielectric layer and lower electrode for capacitors according to an embodiment.

FIG. 5 illustrates the dependence of breakdown voltage on the elemental percentage of carbon at the interface between the dielectric layer 12 and lower electrode 11 for capacitors 10 according to this embodiment. In FIG. 5, the horizontal axis represents the elemental percentage of carbon, and the vertical axis breakdown voltage.

The elemental percentages of carbon at the interface were 50 at %, 30 at %, and 3 at % for the samples fabricated without $N_2$ plasma treatment, with a 30-second $N_2$ plasma treatment at 750 W, and with a 30-second $N_2$ plasma treatment at 1500 W, respectively, regardless of the thickness of the $HfO_x$ film.

As can be seen from this, $N_2$ plasma treatment reduces the carbon concentration at the interface, and the decrease in carbon concentration becomes larger with increasing power input. Moreover, the thickness of the dielectric layer 12 has no impact on the effectiveness of the plasma treatment in lowering the carbon concentration.

As shown in FIG. 5, the capacitors 10 having an 8-nm thick $HfO_x$ film exhibited a substantially constant breakdown voltage regardless of carbon concentrations at the interface between the dielectric layer 12 and lower electrode 11. It appears that when the film thickness is smaller than 10 nm, there is no correlation between the carbon concentration and breakdown voltage.

By contrast, the capacitors 10 having a 16-nm or 24-nm thick $HfO_x$ film exhibited higher breakdown voltages, and therefore were more insulating, with decreasing carbon concentration. At elemental percentages of carbon of 30 at % or less, the breakdown voltage was substantially constant.

The inventors speculate that the observed difference in the carbon-concentration dependence of breakdown voltage according to the thickness of the $HfO_x$ film is associated with the crystallinity of $HfO_x$. XRD results have indicated that $HfO_x$ in a $HfO_x$ film thinner than 10 nm is amorphous.

Whenever TiN and $HfO_x$ films are in contact with each other, crystals at the interface are strained because of the different crystallographic structures of the films. The amorphous $HfO_x$ observed in thin $HfO_x$ films is therefore because $HfO_x$ has a lower potential energy when the atoms therein are arranged randomly than in other states. A film formed by amorphous $HfO_x$ is highly homogeneous and has few sites favorable for dielectric breakdown. Hence the impact on it of carbon existing at the interface between TiN and $HfO_x$ films is small.

It has also been revealed that $HfO_x$ in a 10-nm or thicker $HfO_x$ film forms crystals, specifically monoclinic ones. This is presumably because in a $HfO_x$ film having a certain thickness, $HfO_x$ has a lower potential energy in the crystalline state, in which the atoms are in orderly arrangement, than in the amorphous state. In an $HfO_x$ film thicker than 10 nm, $HfO_x$ is amorphous in the freshly deposited film but readily crystallizes when the film is annealed at a temperature between 300° C. and 400° C. A film of polycrystalline $HfO_x$ contains grain boundaries, in which there are many imperfections that can become conduction carriers, such as oxygen deficiencies and lattice imperfections.

Since the grain boundaries act as paths for dielectric breakdown to occur easily, a polycrystalline insulating film exhibits a lower breakdown voltage than an amorphous film. When the $HfO_x$ film is deposited with carbon existing as an impurity on the TiN film, it is highly probable that grain boundaries or crystal imperfections develop from these carbon atoms. This suggests that dielectric breakdown becomes more likely to occur, and therefore the breakdown voltage lowers, with increasing carbon content.

As demonstrated in FIG. 5, capacitors 10 according to this embodiment can be produced with little decrease in breakdown voltage by virtue of the elemental percentage of carbon at the interface between the lower electrode 11 and dielectric layer 12 being 30 at % or less and, therefore, are highly insulating and good in withstand voltage characteristics.

Figure 6:
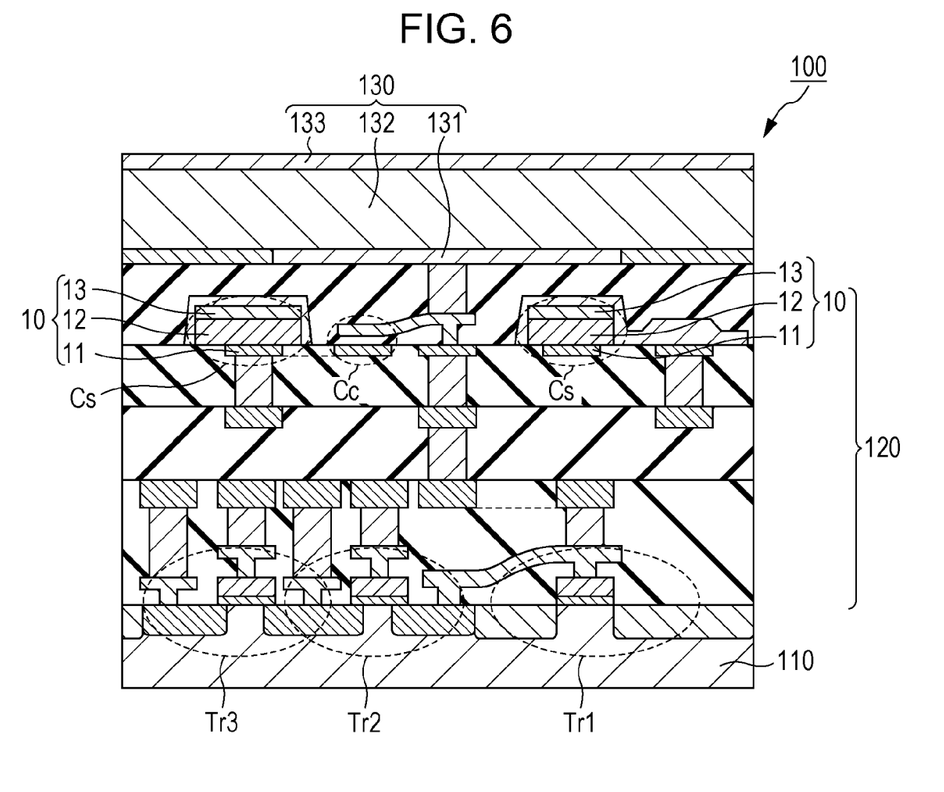
FIG. 6 is a cross-sectional diagram illustrating the cross-sectional structure of an image sensor that includes a capacitor according to an embodiment.

Next, an image sensor 100 including a capacitor 10 according to this embodiment is described with reference to FIG. 6. FIG. 6 is a cross-sectional diagram illustrating the cross-sectional structure of an image sensor 100 according to an embodiment.

The image sensor 100 includes multiple pixels arranged in a matrix. Each pixel includes a photoelectric transducer, which produces an electrical signal from light it receives, and a pixel circuit that processes the electrical signal produced by the photoelectric transducer. FIG. 6 illustrates the cross-sectional structure of a pixel in the image sensor 100.

As illustrated in FIG. 6, an image sensor 100 according to this embodiment is a multilayer image sensor that has a photoelectric transducing film 132 deposited above a pixel circuit. Specifically, the image sensor 100 includes a substrate 110, a multilayer wiring structure 120, and a photoelectric transducer 130.

The substrate 110 is a semiconductor substrate, such as a Si substrate.

The multilayer wiring structure 120 includes a pixel circuit that processes an electrical signal produced by the photoelectric transducer 130, specifically multiple transistors Tr1, Tr2, and Tr3, multiple capacitors Cs and Cc, and multiple wiring lines as illustrated in FIG. 6.

Each of the transistors Tr1, Tr2, and Tr3 is a resetting transistor, a transistor for charge readout, or a transistor for any other purpose. The transistors Tr1, Tr2, and Tr3 are MOSFETs for example. The source and drain regions, for example, of each transistor are in the superficial region of the substrate 110.

The capacitor Cc stores signal charge taken out of the photoelectric transducer 130, and the capacitors Cs remove kTC noise. The transistors, capacitors, and wiring lines are separated from each other by an interlayer insulating film made from an insulator, such as a silicon oxide film.

The photoelectric transducer 130 includes a pixel electrode 131, a photoelectric transducing film 132, and a transparent electrode 133. The pixel electrode 131 and transparent electrode 133 face each other with the photoelectric transducing film 132 therebetween. The photoelectric transducing film 132 is in surface contact with each of the pixel electrode 131 and transparent electrode 133.

Each pixel has its own pixel electrode 131 separated from the other pixels'. The pixel electrode 131 is made of, for example, metal, such as aluminum or copper, or any other electroconductive material.

The photoelectric transducing film 132 is a film of an inorganic material, such as amorphous silicon, or an organic material. When light is incident through the transparent electrode 133, the photoelectric transducing film 132 produces signal charge whose output varies with the amount of light. The signal charge is taken out through the pixel electrode 131 and stored in the capacitor Cc.

The transparent electrode 133 is made of a transparent electroconductive material, such as ITO. The transparent electrode 133 and photoelectric transducing film 132 are, for example, shared by each pixel.

By way of example, the capacitors Cs can be capacitors 10 according to the above embodiment. Specifically, the image sensor 100 includes the capacitors 10 as the capacitors for removing kTC noise as illustrated in FIG. 6. To form each capacitor 10, a lower electrode 11, a dielectric layer 12, and an upper electrode 13 are stacked in this order anywhere above the substrate 110 and inside the multilayer wiring structure 120.

Alternatively, the capacitor Cc, for storing signal charge, may be a capacitor 10. This helps prevent whiteout in the case of high-intensity incident light, ensuring high saturation capacity of the pixels.

By virtue of the high insulating properties and good withstand voltage characteristics of the capacitor(s) 10, the image sensor 100 according to this embodiment is highly reliable.

OTHER EMBODIMENTS

Although the foregoing has described embodiments of a capacitor, an image sensor, and a method for producing a capacitor according to one or more aspects, the present disclosure is not limited to these embodiments. The disclosure encompasses any embodiment obtained by making modifications, to an above embodiment, that those skilled in the art could think of or by combining elements in different embodiments unless the embodiment departs from the spirit and scope of the disclosure.

For example, the plasma treatment of the uppermost surface of the lower electrode 11 may be performed in an atmosphere that is not a nitrogen or oxygen atmosphere, such as an atmosphere containing argon or any other inert gas.

In another exemplary embodiment, the capacitor 10 may be a non-parallel-plate capacitor. The following describes a capacitor according to a variation of an embodiment with reference to FIG. 7.

Figure 7:
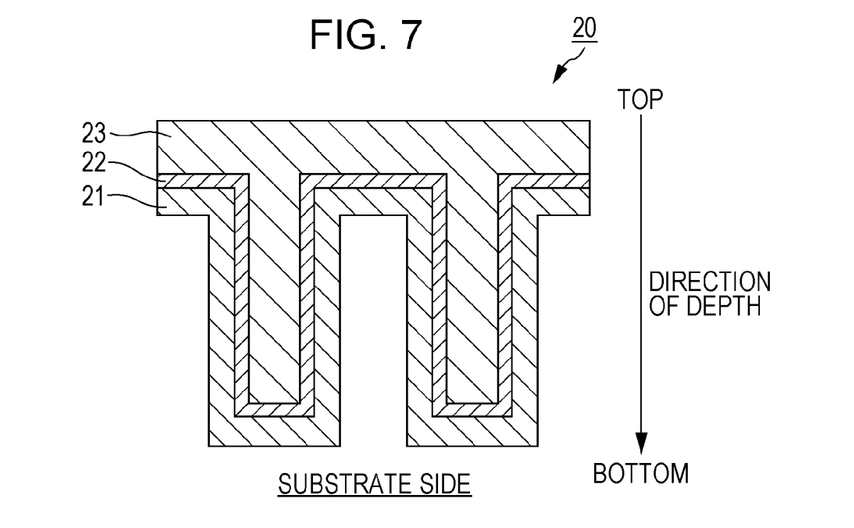
FIG. 7 is a cross-sectional diagram illustrating an exemplary structure of a capacitor according to a variation of an embodiment.

FIG. 7 is a cross-sectional diagram illustrating an exemplary structure of a capacitor 20 according to this variation. The capacitor 20 in FIG. 7 is not a parallel-plate capacitor but a three-dimensionally structured capacitor. Specifically, the capacitor 20 includes a lower electrode 21, a dielectric layer 22, and an upper electrode 23. The capacitor 20 is different from a capacitor 10 according to an embodiment in cross-sectional structure but equivalent to the capacitor 10 in all other respects, such as the material for each layer and the method for production.

As illustrated in FIG. 7, the interface between the lower electrode 21 and dielectric layer 22 has a trenched shape, depressed in part in the direction of depth, or from the upper electrode 23 toward the lower electrode 21. The dielectric layer 22 conforms to this trenched shape and is substantially uniform in thickness. In this variation, the lower electrode 21 also conforms to the trenched shape and is substantially uniform in thickness. The upper electrode 23 has a substantially flat top surface and a bottom surface conforming to the trenched shape.

In this structure, the upper electrode 23 and lower electrode 21 face each other over a larger area because they are opposite along the sides of the trenches as well. The surface area of the capacitor 20 is therefore larger than that of the capacitor 10 in FIG. 1 for the same size in plan view, and so is the capacitance.

Although the trenched shape in FIG. 7 has two trenches, there may be one or three or more trenches. Increasing the number of trenches or creating deeper trenches will increase the capacitance of the capacitor 20.

In this variation, the lower electrode 21, dielectric layer 22, and upper electrode 23 are each formed by ALD, for example as a TaN film, a $ZrO_x$ film, and a TaN film deposited in this order. This is an easy way to form these layers uniform in thickness along the sides of the trenches.

To each of the foregoing embodiments, various modifications, substitutions, additions, and/or omissions can be made within the scope of the claims or equivalents thereof.

What is claimed is:

1. A capacitor comprising:
   a first electrode;
   a second electrode facing the first electrode; and
   a dielectric layer disposed between the first and second electrodes and being in contact with each of the first and second electrodes, wherein:
   the first electrode and the second electrode contain carbon, the dielectric layer contains carbon,
   in a middle portion of the first electrode between an uppermost surface of the first electrode facing the dielectric layer and a lowermost surface of the first electrode opposed to the uppermost surface of the first electrode, an elemental percentage of carbon is 30 atomic % or less,
   a highest peak of an elemental percentage of carbon of the dielectric layer is smaller than a highest peak of an elemental percentage of carbon of the second electrode, and
   a highest peak of an elemental percentage of carbon of the first electrode is smaller than an elemental percentage of carbon of the second electrode in a middle portion of the second electrode between a lowermost surface of the second electrode facing the dielectric layer and a uppermost surface of the second electrode opposed to the lowermost surface of the second electrode.

2. The capacitor according to claim 1, wherein the dielectric layer is made of at least one selected from the group consisting of a hafnium oxide and a zirconium oxide.

3. The capacitor according to claim 1, wherein the first electrode is made of at least one selected from the group consisting of a titanium nitride and a tantalum nitride.

4. The capacitor according to claim 1, wherein:
   an interface between the dielectric layer and the first electrode has a trenched shape, depressed in part in a direction from the second electrode toward the first electrode; and
   the dielectric layer is provided along the trenched shape.

5. The capacitor according to claim 1, wherein the dielectric layer has a thickness of 10 nm or more.

6. The capacitor according to claim 1, wherein the dielectric layer is monoclinic in crystallographic structure.

7. The capacitor according to claim 1, wherein in the uppermost surface of the first electrode facing the dielectric layer, the elemental percentage of carbon is 3 atomic % or more.

8. The capacitor according to claim 1, wherein the elemental percentage of carbon in the middle of the first electrode is higher than the elemental percentage of carbon in the uppermost surface of the first electrode.

9. The capacitor according to claim 1, further comprising:
   a semiconductor substrate, wherein
   the first electrode is disposed between the semiconductor substrate and the second electrode.

10. The capacitor according to claim 1, wherein
    a highest peak of an elemental percentage of carbon of the capacitor coincides with the highest peak of the elemental percentage of carbon of the second electrode.

11. The capacitor according to claim 1, wherein
    the first electrode is made of a titanium nitride and is in direct contact with the dielectric layer.

12. The capacitor according to claim 11, wherein
    the second electrode is made of a titanium nitride and is in direct contact with the dielectric layer.

13. An image sensor comprising:
    at least one selected from the group consisting of a photoelectric transducer and a photodiode; and
    a capacitor, wherein:
    the capacitor includes:
    a first electrode;
    a second electrode facing the first electrode; and
    a dielectric layer disposed between the first and second electrodes and being in contact with each of the first and second electrodes,
    the first electrode and the second electrode contain carbon, the dielectric layer contains carbon,
    in a middle portion of the first electrode between an uppermost surface of the first electrode facing the dielectric layer and a lowermost surface of the first electrode opposed to the uppermost surface of the first electrode, an elemental percentage of carbon is 30 atomic % or less,
    a highest peak of an elemental percentage of carbon of the dielectric layer is smaller than a highest peak of an elemental percentage of carbon of the second electrode, and
    a highest peak of an elemental percentage of carbon of the first electrode is smaller than an elemental percentage of carbon of the second electrode in a middle portion of the second electrode between a lowermost surface of the second electrode facing the dielectric layer and a uppermost surface of the second electrode opposed to the lowermost surface of the second electrode.

14. The image sensor according to claim 13, wherein
    the dielectric layer is made of at least one selected from the group consisting of a hafnium oxide and a zirconium oxide.

15. The image sensor according to claim 13, wherein the first electrode is made of at least one selected from the group consisting of a titanium nitride and a tantalum nitride.

16. The image sensor according to claim 13, wherein:
an interface between the dielectric layer and the first electrode has a trenched shape, depressed in part in a direction from the second electrode toward the first electrode; and
the dielectric layer is provided along the trenched shape.

17. The image sensor according to claim 13, wherein in the uppermost surface of the first electrode facing the dielectric layer, the elemental percentage of carbon is 3 atomic % or more.

18. The image sensor according to claim 13, wherein the elemental percentage of carbon in the middle of the first electrode is higher than the elemental percentage of carbon in the uppermost surface of the first electrode.

19. The image sensor according to claim 13, wherein the dielectric layer has a thickness of 10 nm or more.

20. The image sensor according to claim 13, wherein the dielectric layer is monoclinic in crystallographic structure.

* * * * *